United States Patent [19]
Mangum, Jr. et al.

[11] 4,112,499
[45] Sep. 5, 1978

[54] DIGITAL TRANSIENT DISCRIMINATOR WITH NOISE SPIKE CLIPPING

[75] Inventors: Norman W. Mangum, Jr.; Howard W. Ripy, both of Palm Beach Gardens, Fla.

[73] Assignee: United Technologies Corporation, Hartford, Conn.

[21] Appl. No.: 778,640

[22] Filed: Mar. 17, 1977

[51] Int. Cl.² .................. G06F 13/00; G06F 15/20
[52] U.S. Cl. .................. 364/732; 60/39.28 T; 364/574; 364/715
[58] Field of Search .......... 364/828, 572, 574, 431, 364/724, 732, 715; 340/248 P, 248 C, 263, 271; 60/39.28 R, 39.28 T

[56] References Cited

U.S. PATENT DOCUMENTS

| | | |
|---|---|---|
| 3,590,229 | 6/1971 | Humphreys .................. 235/183 |
| 3,928,756 | 12/1975 | Auray .................. 235/183 |
| 3,946,211 | 3/1976 | Jenkins, Jr. .................. 235/183 |

FOREIGN PATENT DOCUMENTS 47-1,052  1/1972  Japan.................. 235/183

*Primary Examiner*—Felix D. Gruber
*Attorney, Agent, or Firm*—Norman Friedland

[57] ABSTRACT

A digital discriminator having circuit means for discriminating a unidirectional transient in the input signal over a two or more compute cycle period. Noise spike clipping by providing a programmable constant in a feedback circuit is disclosed and serves to clip the signal in one given direction giving positive sensitivity of that signal in the other direction.

4 Claims, 2 Drawing Figures

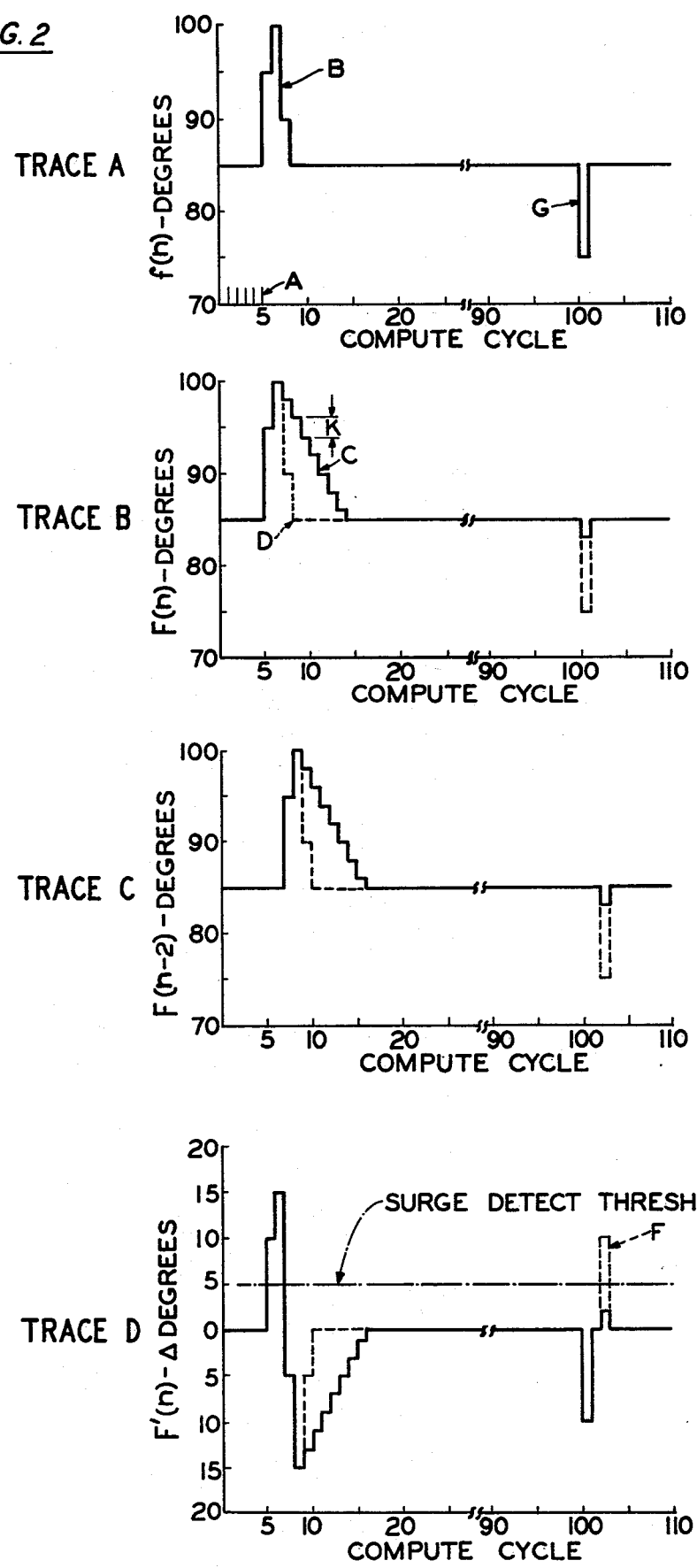

DIGITAL TRANSIENT DISCRIMINATOR WITH NOISE SPIKE CLIPPING

BACKGROUND OF THE INVENTION

This invention relates to a digital device for computing a rate of change of an input signal and particularly to circuit means for noise spike clipping in a given direction to discern a unidirectional transient in the input signal.

Digital devices for measuring the rate of change of an input signal are well known in the art. Typically, the input signal is summed with one or more compute cycle delay of the input so that the output of the transient signal is indicative of the rate of change in either polarity. In application, say for a surge control for a gas turbine engine, it may be allowable to sense in only a given polarity and hence it may be possible to discriminate the input signal for only a unidirectional transient.

We have found that we can discriminate a unidirectional transient in the input signal over a two compute cycle period and provide a noise spike clipping circuit. This invention contemplates selecting the maximum of an input transient signal which is a function of the variable being sensed at a given time and the summed value of a function of the variable at one compute cycle delay and a programmed constant. The input signal as first measured can be less than the value of the delayed signal by at most the value of the constant. Hence, the negative spike is clipped by the amount selected by the value of the constant. By employing clipping, lower threshold values for control system action or faster filter time constants can be realized while diminishing the potential false indication due to noise spikes.

The device has been found to have particular utility in a surge control for a gas turbine engine although it should be understood that the invention has utility in any other application where a unidirectional transient in the input signal is desired. As for example in U.S. application Ser. No. 762,763 filed on Jan. 26, 1977 be E. Preti and H. W. Ripy and assigned to the same assignee, a surge control that responds to the temperature at the inlet of the engine is disclosed. In that particular installation surge can de detected by a sudden rise in engine inlet temperature, but since immediate corrective action is required because surge has been initiated, false detection can be hazardous, and hence cannot be tolerated. Hence, maximum sensitivity and response of the detection circuit is desired to assure that recovery can be achieved before surge has been allowed to become destructive.

In actual tests, a surge detection system employing this invention has proven to be efficacious and no false surge detections were recorded. The output transient from the computed temperature signal triggers the surge recovery logic of the control at a positive value of 1.25° F. per compute cycle after being filtered. The spike clipping circuit reduces downspikes to a maximum of 2° F. per compute cycle. Obviously the spike reduction allows a faster filter time constant to be used in the transient filter hence increasing response time of the detection circuit and allowing surge recovery to be initiated sooner.

SUMMARY OF THE INVENTION

A still further object of the invention is to provide a circuit that discriminates a unidirectional transient in an input signal by providing a noise spike clipping circuit.

Other features and advantages will be apparent from the specification and claims and from the accompanying drawings which illustrate an embodiment of the invention.

BRIEF DESCRIPTION OF THE DRAWINGS

FIG. 2 is a graph of temperature vs. time and the rate of change value of that signal showing the effect of noise spike clipping.

DESCRIPTION OF THE PREFERRED EMBODIMENT

Figure 1:
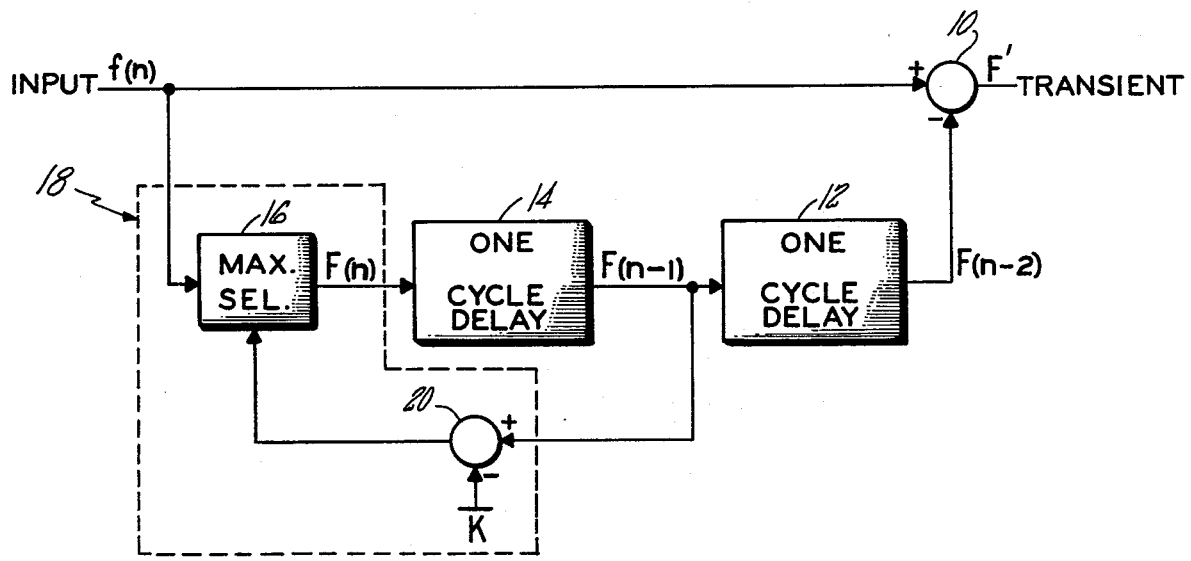
FIG. 1 is a block diagram illustrating this invention.

Referring to FIG. 1 as shown in a digital discriminator for resolving the input signal $f(n)$ into its rate of change value. Input signal $f(n)$ which is at time $n$ is applied to summer 10 where it is added to the value of the output $F(n-2)$ from the compute cycle delay illustrated by block 12.

The input ($F(n-1)$) to the one compute cycle delay 12 is at the value from block 14 which is the one compute cycle delay immediately following the stored signal in block 12 and the stored value of block 14 in the stored signal immediately preceding the time sequence of the input signal $f(n)$. Stated otherwise, $F(n-1)$ is the value of $F(n)$ delayed one compute cycle and $F(n-2)$ is the value of $F(n)$ delayed two compute cycles.

The maximum selector 16 and summer 20 form the clipping circuit 18 which outputs the larger of the input applied thereto namely signal $f(n)$ and the output from the summer 20 to which is added the K which is a programmable constant. This value determines both polarity and size of the clipped signal. To achieve positive transient ($F'$) the noise spikes in the opposite direction on the input signal $f(n)$ are attenuated by limiting the maximum amplitude to $-K$. Hence, the adverse spike clipping serves to diminish transients on the trailing edge of adverse spikes.

In operation, if $F(N-1) - K$ output from summer 20 is greater than $f(n)$ the maximum selector 16 will allow it to be processed. This signal is the clipped input signal. Hence $F(n)$ can be less than $F(n-1)$ by at most the value of the programmed constant K. Obviously, the value $F'$ is the output transient calculated as the difference between $f(n)$ and $F(n-2)$. Thus, $F'$ is equal to twice the average per cycle change in $F(n)$ over a two compute cycle period.

The operation of the rate of change and clipping circuit can be best illustrated by referring to tracings A, B, C and D of FIG. 2 showing a surge signal and a clipped spike signal.

Trace A shows input signal $f(n)$ of the sensed analogue temperature signal at each compute cycle after digitization, where the vertical lines A represent one compute cycle and curve B is the digitized value.

Trace B is the output $F(n)$ of the clipping circuit 18, such that during temperature rise the output as shown by curve C follows the input $f(n)$. In decreasing temperature sense the rate of decrease can only be of a magnitude permitted by the programmable constant K (illustrated by the height of step K). It will be appreciated that without clipping the negative slope of the output would follow the negative slope of the input illustrated by the dash line D.

Trace C is the same as trace B but delayed two cycles.

And Trace D is the output F′ which is the algebraic difference of $f(n)$ and $F(n-2)$ illustrated as the difference between Trace A and Trace C.

As an Example

As noted at compute cycle 5 $fn = 95$, $F(n-2) = 85$ making F′ = 10 which is the rate of change reflected in the input signal $f(n)$. However at compute cycle 10 $f(n) = 85$ and $F(n-2) = 96$ and F′ = $-11$. without clipping $F'(n-2) = 0$ and F′ = 0. The error induced by clipping is of no consequence because the surge control only responds to positive values of F′ and hence the signal is only unidirectional.

As noted from Trace D the output will trigger at the two compute cycle value of the rate of changes arbitrarily selected for this example as 5. When the temperature rises in a surge situation the surge recovery mechanism will be triggered and the negative clipping circuit is of no consequence.

However given a condition where a downward spike created by noise is sensed, the clipping circuit 18 prevents activating the surge recovery mechanism. This is illustrated by the downward spike shown as curve G in Tracing A. At compute cycle 100, $f(n) = 75$ and $F'(n) = -10$. At compute cycle 101 the signal returns to its original value of 85. However, owing to clipping the rate $F'(n) = +2$ at cycle 102 without clipping the rate of cycle 102 would have been +10 as shown by dash line F which would have been falsely detected as a surge.

As is apparent from the foregoing clipping is only effective in the negative direction and conversely is not effective in a positive direction. This is abundantly important when used as a surge detection circuit because it does not reduce sensitivity in a positive direction.

Obviously without clipping the rate of change value of the adverse spike shown as curve G would produce a false detection as shown by the dash line F. Thus, a single cycle downspike of a given magnitude would present an apparent transient of half that magnitude per cycle at the output 2 cycles later. With clipping, this apparent transient is limited to a maximum of K/2 units per cycle.

It should be understood that the invention is not limited to the particular embodiments shown and described herein, but that various changes and modifications may be made without departing from the spirit or scope of this novel concept as defined by the following claims.

We claim:

1. For a sensor that produces an input signal to logic means for determining the unidirectional transient in said input, said logic including means responsive to an output signal for generating a first delayed cycle signal and a second delayed cycle signal, first summer means for combining the first delayed cycle signal with a constant, second summer means for combining the second delayed cycle signal with said input signal and a maximum selector means responsive to said input signal and the output of said first summer means for selecting the higher value of either said input signal or the output of said first summer means to generate an input signal to said generating means.

2. For a sensor as in claim 1 wherein said constant is a negative value and said input signal has a positive and negative polarity and said logic means is a feed forward processor processing said input signal so that its positive polarity is at its rate of change value.

3. Apparatus for generating a unidirectional rate of change signal from an input signal having means for clipping noise spikes in a given polarity of said input including a maximum selector responsive to said input signal and the output of a first summer for generating an input signal to a first cycle delay signal and a second cycle delay signal means, said first summer combining a first cycle delay signal with a constant having a negative value, and a second summer responsive to said input signal and the output of said first cycle delay signal and second cycle delay signal means for producing an output signal indicative of the rate of change value of the positive polarity of said input signal.

4. In an automatic rate of change controller in response to an input signal comprising the steps of:
   generating a first delay cycle signal and a second delay cycle signal in response to an output signal,
   selecting the output signal utilized in the above step of generating from the higher value of the input signal or the first delay cycle signal combined with a preselected constant for clipping noise spikes in a given polarity,
   summing the input signal with the second delay cycle signal whose value is indicative of a unidirectional transient of the input signal.

* * * * *